(12) United States Patent
Fook et al.

(10) Patent No.: US 7,768,856 B2
(45) Date of Patent: Aug. 3, 2010

(54) CONTROL OF TEMPERATURE SLOPE FOR BAND GAP REFERENCE VOLTAGE IN A MEMORY DEVICE

(75) Inventors: Leong Mun Fook, Penang (MY); Ang Boon Aik, Santa Clara, CA (US); Ong Mee Choo, Penang (MY)

(73) Assignee: Spansion LLC, Sunnyvale, CA (US)

( * ) Notice: Subject to any disclaimer, the term of this patent is extended or adjusted under 35 U.S.C. 154(b) by 318 days.

(21) Appl. No.: 11/929,097

(22) Filed: Oct. 30, 2007

(65) Prior Publication Data

US 2009/0109742 A1    Apr. 30, 2009

(51) Int. Cl.
*G11C 7/04* (2006.01)

(52) U.S. Cl. .................. 365/211; 365/189.09; 365/212

(58) Field of Classification Search ............. 365/211 O, 365/212 X, 189.09 X, 230.06, 211, 212, 189.09
See application file for complete search history.

(56) References Cited

U.S. PATENT DOCUMENTS

| | | | |
|---|---|---|---|
| 6,205,074 B1 * | 3/2001 | Van Buskirk et al. | ....... 365/211 |
| 6,400,638 B1 * | 6/2002 | Yamada et al. | ......... 365/230.06 |
| 7,009,904 B2 * | 3/2006 | Kim | ............................. 365/211 |
| 7,266,031 B2 * | 9/2007 | Kim et al. | .................... 365/211 |

* cited by examiner

*Primary Examiner*—VanThu Nguyen
(74) *Attorney, Agent, or Firm*—Turocy & Watson, LLP

(57) ABSTRACT

Systems and/or methods are presented that can facilitate regulating performance of operations in a memory device based on controlling an operating temperature slope associated with the memory device. A regulator component can facilitate controlling the operating temperature slope level and controlling a reference voltage(s) associated with a word-line(s) and/or bit-line(s) to facilitate execution of operations in a memory, while also controlling a respective current level(s) associated with the reference voltage to minimize errors in the memory or harm to the memory. The reference voltage can be controlled based on a first resistance and the current level can be controlled based on a second resistance that can be based on the first resistance. An analyzer component can facilitate determining a desired operating temperature slope level. Trim bits can be employed to facilitate setting the first resistance and/or the second resistance.

20 Claims, 11 Drawing Sheets

CONTROL OF TEMPERATURE SLOPE FOR BAND GAP REFERENCE VOLTAGE IN A MEMORY DEVICE

BACKGROUND

A wide variety of memory devices can be used to maintain and store data and instructions for various computers and similar systems. In particular, flash memory is a type of electronic memory media that can be rewritten and that can retain content without consumption of power. Flash memory has become popular, at least in part, because it combines the advantages of the high density and low cost of erasable programmable read only memory (EPROM) with the electrical erasability of electronically erasable programmable read only memory (EEPROM). Flash memory is nonvolatile; it can be rewritten and can hold its content without power. It is used in many portable electronic products, such as cell phones, portable computers, voice recorders, thumbnail drives and the like, as well as in many larger electronic systems, such as cars, planes, industrial control systems, etc. The fact that flash memory can be rewritten as well as its retention of data without a power source, small size and light weight have all combined to make flash memory devices useful and popular means for transporting and maintaining data.

During programming of a flash memory device, a voltage can be generated on the bit-line (BL) or word-line (WL) of the selected flash memory cell in the device to facilitate programming of data to the BL or WL. Typically, compensation on the BL voltage and WL voltage can be either overcompensated or undercompensated due to the characteristics of the memory device. As a result, the programming time may not be kept constant across operating temperature. For example, a transistor associated with a memory cell can typically be "weaker" at "hot" temperature, such as during a programming operation. As a result, the programming speed can be decreased. Further, compensation inaccuracy can also be due to differences between simulation of the operation of silicon behavior and the silicon utilized in forming the memory device, and/or die-to-die variations in a wafer. It is desirable to increase the programming speed of flash memory devices, as well as maintain or improve the accuracy and reliability of flash memory devices.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems and/or methods that facilitate programming of data in a memory device, such as a flash memory device. In accordance with one aspect of the disclosed subject matter, during a program operation to write data to a memory cell(s) in a memory array (e.g., core) in a memory device, a desired voltage can be generated on a bit-line and/or word-line of a selected memory cell(s). During the program operation, a regulator component can be employed that can facilitate regulating the voltage level associated with a bit-line(s) and/or word-line(s) based on an operating temperature slope level associated with the memory array to facilitate increasing the programming speed of the memory.

In accordance with an aspect of the disclosed subject matter, the regulator component can facilitate regulating the band gap reference voltage to facilitate increasing the voltage that can be generated and supplied to a respective bit-line and/or word-line during a programming operation to compensate for the "weakness" of the transistor(s) associated with the memory cell(s) when operating at "hot" temperature, as the transistor(s) can be operating at "hot" temperature during the programming operation. The amount of compensation and thus the amount of increase in the voltage level in a particular band gap circuit can be based on the operating temperature slope level associated with the memory and transistors included therein. The regulator component can facilitate adjusting the band gap reference voltage based on an operating temperature slope associated with the memory. Further, the regulator component can facilitate maintaining a desired current level in the band gap reference circuit, so there is substantially no offset in the current level in the band gap circuit as a result of any compensation in the reference voltage level.

In accordance with an embodiment of the disclosed subject matter, the regulator component can facilitate regulating the voltage level of a particular bit-line(s) or word-line(s) by employing trim bits that can facilitate adjusting the operating temperature slope level associated with a memory and thereby a reference voltage level and/or can control (e.g., adjust) a current level in the band gap circuit to counter potential offset in the current level due to a change (e.g., increase) in the reference voltage level. The trim bits can operate such that the operating temperature slope level, and thus the reference voltage level, and/or the current level in the band gap circuit can be controlled based on the respective trim bits that are selected as "high" or "low." For example, with regard to the reference voltage level, as the total trim bit value increases, the operating temperature slope level can be increased to facilitate increasing the reference voltage level.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
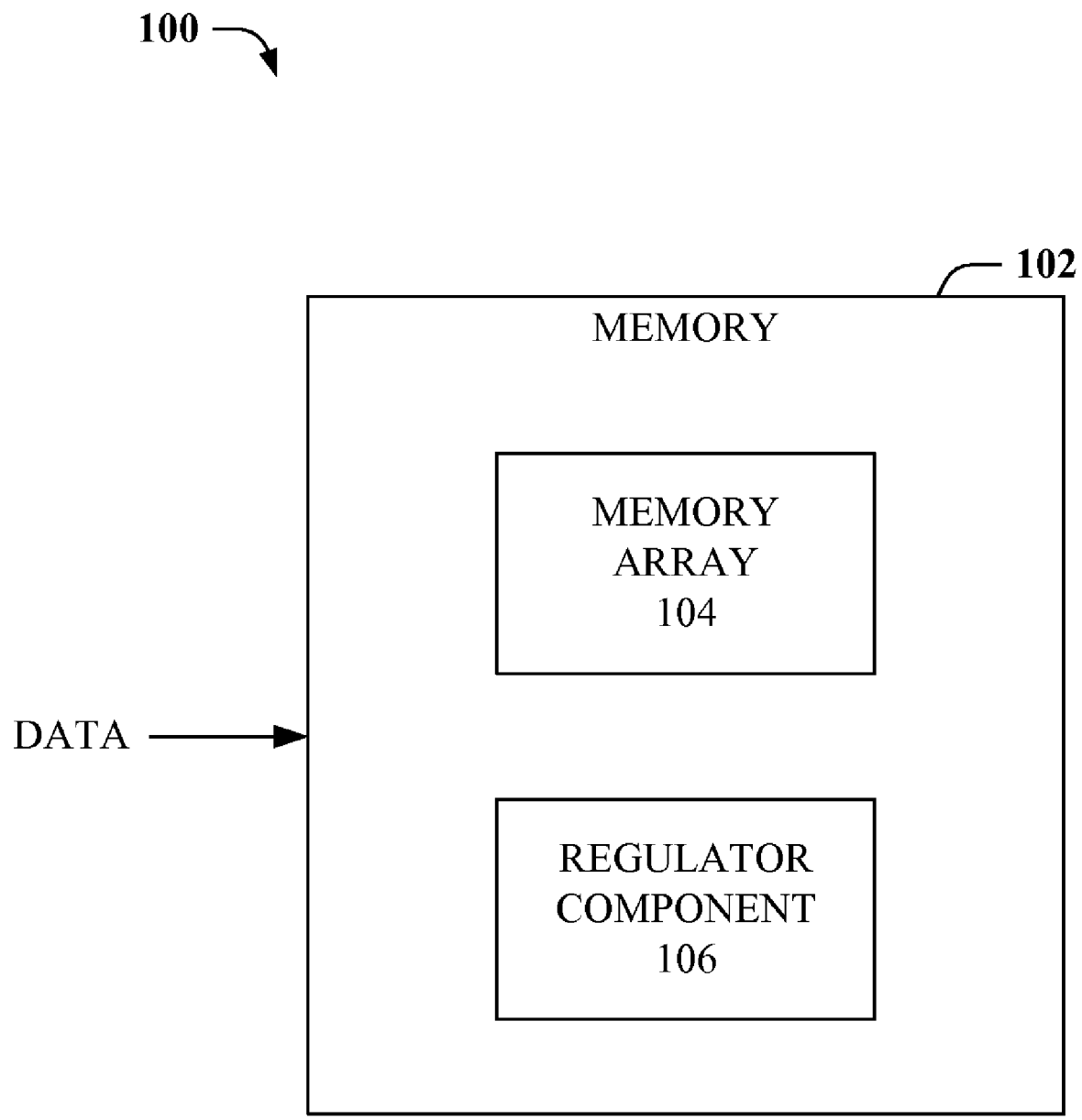
FIG. 1 illustrates a block diagram of a system that facilitates execution of operations in a memory in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Operation speeds in a memory device (e.g., flash memory) can vary based on the operating temperature of the device due to the nature of the components (e.g., transistors) therein, die variations, and/or differences between device simulation and the actual device. For example, during programming a memory device can be at a "hot" temperature, where the transistors can be "weaker" and can thereby result in the operation speed being impacted, where the temperature operating slope is flat, and therefore, the programming speed is not constant across the operating temperature. It is desirable to provide compensation to increase the programming speed of memory devices while not overcompensating, which can result in harm to memory components and/or result in operation errors.

Systems and/or methods that can facilitate controlling (e.g., increasing) an operating temperature slope to facilitate compensating for issues (e.g. programming speed not constant across temperature of the memory device) associated with a memory device are presented. The disclosed subject matter can include a regulator component that can facilitate controlling the operating temperature slope level and controlling a reference voltage(s) associated with a word-line(s) and/or bit-line(s) to facilitate increasing programming speed, while also controlling a respective current level(s) associated with the reference voltage to prevent or reduce the risk of harm to the memory or errors in the memory.

Now turning to the figures, FIG. 1 illustrates a system 100 that facilitates regulation of a reference voltage level to facilitate increasing the programming speed of a memory device. System 100 can include a memory 102 that can store data and can include a plurality of transistors to facilitate data storage. In accordance with one embodiment, the memory 102 can be a flash memory (e.g., single-bit flash, multi-bit flash) which can utilize transistors to facilitate storing data. The memory 102 can include a memory array 104 that can be comprised of a plurality of memory cells (not shown).

The memory 102 can also include a regulator component 106 which can facilitate providing a reference voltage, based on an operating temperature slope level associated with the memory 102, to selected bit-lines (hereinafter also referred to as BLs) (not shown) and/or word-lines (hereinafter also referred to as WLs) (not shown) of the memory array 104 to facilitate performing operations (e.g. programming, reading, erasing) in the memory 102. The regulator component 106 can facilitate regulating a reference voltage level(s) and/or a current level(s) supplied to a respective BL(s) and/or WL(s) associated with the memory array 104 to facilitate executing operations (e.g., programming operations) on memory locations (e.g., memory cells) in memory 102.

Conventionally, a memory device 102 can have a flat operating temperature slope such that a reference voltage level can be the same regardless of whether the operating temperature of the memory device 102 is high (e.g., at "hot" temperature), such as can occur during a programming operation, or is relatively low, such as can occur when the a read operation is being executed in the memory 102 or the memory 102 is idle, for example. However, typically, due to the nature of transistors, the transistors in the memory 102 typically can be "weaker" at "hot" and as a result the programming speed of the memory can be negatively impacted.

In accordance with an aspect of the disclosed subject matter, a positive operating temperature slope can be employed in the memory 102 to facilitate increasing and/or improving the programming speed of the memory 102. To facilitate increasing and/or improving the programming speed of the memory 102, the regulator component 106 can facilitate increasing the reference voltage (e.g., $V_{ref}$) based on the positive operating temperature slope level to facilitate increasing the voltage supplied to a particular WL(s) and/or BL(s) during a programming operation. The regulator component 106 can facilitate controlling the reference voltage while also controlling or maintaining the current associated with the reference voltage in order to reduce the risk of harming memory components and/or operation errors due to overcompensation.

Figure 2:
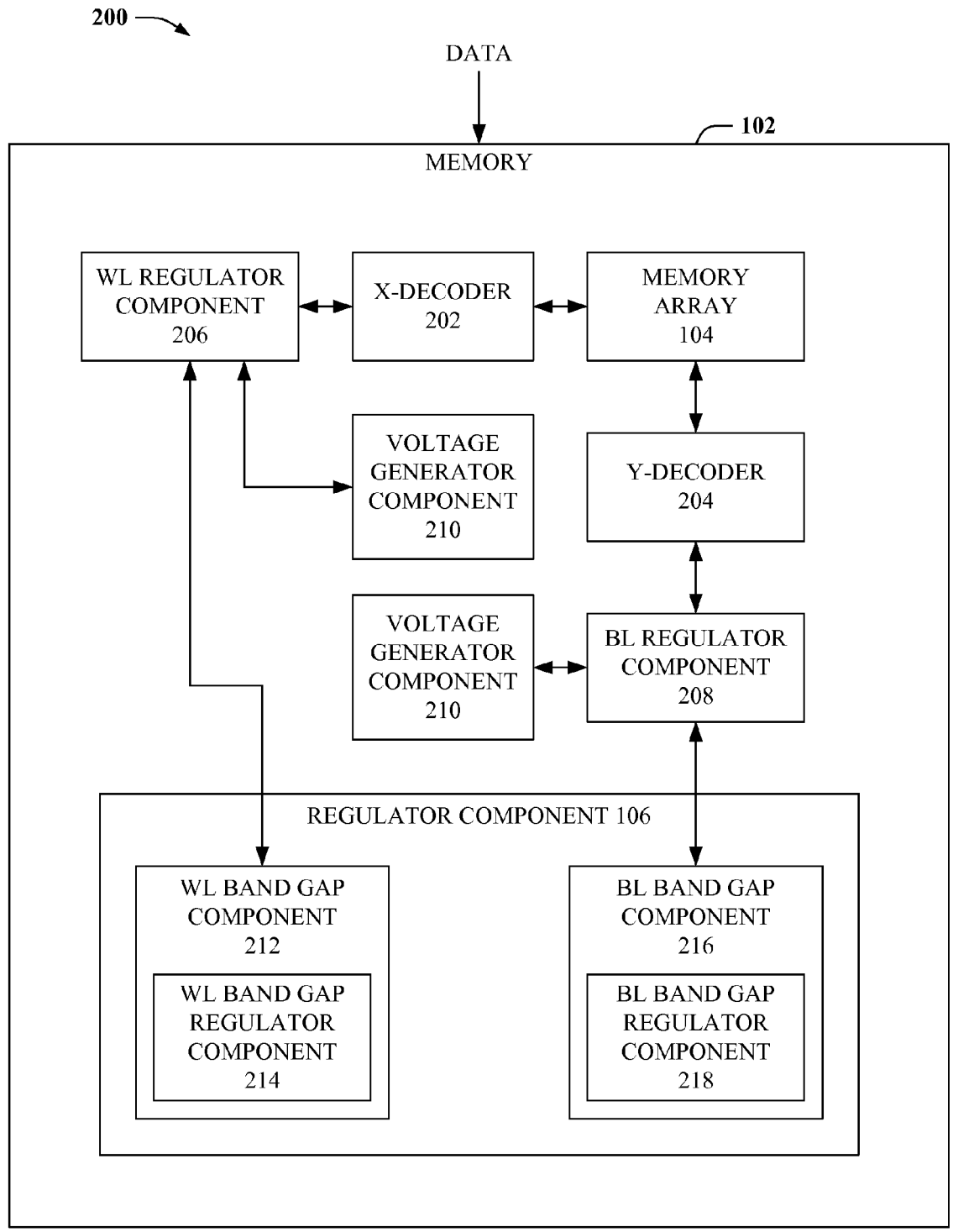
FIG. 2 depicts a block diagram of another system that facilitates execution of operations in a memory in accordance with an aspect of the disclosed subject matter.

Referring to FIG. 2, a system 200 that can facilitate regulation of a reference voltage to facilitate programming data to a memory is illustrated. System 200 can include a memory 102 that can store data (e.g., write), provide data (e.g., read), and remove data (e.g., erase). In accordance with an embodiment of the disclosed subject matter, the memory 102 can be a flash memory device (e.g., single-bit flash memory, multi-bit flash memory). The memory 102 can include a memory array 104 that can be comprised of a plurality of memory locations to/from which data can be written, stored, read, and/or erased. In accordance with an aspect, the memory locations can be memory cells (not shown) that can be selected to have an operation (e.g., program, read, erase) performed thereon based on respective voltage levels of WLs and/or BLs associated with a respective memory cell. The memory cells can each include or be associated with a transistor(s).

System 200 can also include an X-decoder 202 that can include circuitry to facilitate selection of a desired WL(s) associated with a memory cell(s) upon which a desired operation can be performed. System 200 can further include a Y-decoder 204 that can include circuitry to facilitate selection of a desired BL(s) associated with a memory cell(s) upon which a desired operation can be performed.

The X-decoder 202 can be associated with a WL regulator component 206 that can facilitate providing a voltage level to the X-decoder 202, which can facilitate providing such voltage level to a desired WL(s) in array 104. The Y-decoder 204 can be associated with a BL regulator component 208 that can facilitate providing a voltage level to the Y-decoder 204, which can facilitate providing such voltage level to a desired BL(s) in array 104.

The WL regulator component 206 and/or BL regulator component 208 can be associated with the regulator component 106, which can facilitate providing desired respective reference voltage levels (e.g. WL reference voltage, BL reference voltage), based on an operating temperature slope level, to the WL regulator component 206 and/or the BL regulator component 208. The WL regulator component 206 can be associated with a voltage generator 210 that can facilitate generating a voltage associated with an operation (e.g., write, read, erase) which can be provided to the WL regulator component 206 to facilitate providing a desired voltage level to the X-decoder 202 and desired WL(s) in the memory array 104. The BL regulator component 208 can be associated with another voltage generator 210 that can facilitate generating a voltage associated with an operation which can be provided to the BL regulator component 208 to facilitate providing a desired voltage level to the Y-decoder 204 and desired BL(s) in the memory array 104.

In accordance with an aspect of the disclosed subject matter, the regulator component 106 can also include a WL band gap component 212 that can facilitate regulating and providing a reference voltage associated with a WL(s) to the WL regulator component 206. The regulator component 106 can further include a BL band gap component 216 that can facilitate regulating and providing a reference voltage associated with a BL(s) to the BL regulator component 208.

Conventionally, the reference voltage associated with a WL or BL can be based on a flat temperature slope such that the voltage can remain constant across operating temperatures associated with a particular memory device. However, in memory devices, undercompensation can occur due to, for example, the nature of transistors in the memory 102, simulation of the memory device 102 as compared to the actual device, and/or die-to-die variations, which can result in the operation time being slower at "hot" temperature. That is, when the memory 102 is operating at a higher temperature, such as when the memory 102 is performing a programming operation, the time to perform the operation can be increased.

In accordance with an aspect of the disclosed subject matter, the WL band gap component 212 can include a WL band gap regulator component 214 that can facilitate controlling a reference voltage level associated with a WL(s) based on an operating temperature slope level (e.g., positive temperature slope level) while also controlling a current associated with such reference voltage to facilitate compensation of the WL voltage during programming. The WL band gap regulator component 214 can employ a first resistance that can facilitate controlling (e.g., increasing) the operating temperature slope level and correspondingly controlling a reference voltage associated with a WL(s). The increase in the operating temperature slope level can compensate for undercompensation that can occur when the memory device 102 is at "hot."

The WL band gap regulator component 214 can also employ a second resistance that can be placed in parallel with the first resistance in the band gap circuit to facilitate controlling the current level associated with the reference voltage that can be associated with a WL(s). The value of the second resistance can be based on or a function of the first resistance value. In one aspect, the respective values of the first resistance and the second resistance can be based on a ratio associated with the first resistance/second resistance.

For example, a reference is voltage can be increased based on an increase in the first resistance in order to compensate for a slower programming speed due to characteristics of the memory device 102 at "hot". The second resistance, which can be in parallel to the first resistance and can be associated with a ground, can be decreased to facilitate controlling (e.g., decreasing) the current level associated with the reference voltage so that excessive voltage is not provided to the WL regulator component 206.

In accordance with another aspect of the disclosed subject matter, the BL band gap component 216 can include a BL band gap regulator component 218 that can facilitate controlling a reference voltage associated with a BL(s) based on an operating temperature slope level (e.g., positive temperature slope level) while also controlling a current associated with such reference voltage to facilitate compensation of the BL voltage during programming. The BL band gap regulator component 216 can utilize a first resistance that can facilitate controlling the operating temperature slope level and correspondingly controlling a reference voltage level associated with a BL(s).

The BL band gap regulator component 216 can also employ a second resistance that can be placed in parallel with the first resistance in the band gap circuit associated with a BL to facilitate controlling the current level associated with the reference voltage that can be associated with a BL(s). The value of the second resistance can be based on or a function of the first resistance value. In one aspect, the respective values of the first resistance and the second resistance can be based on a ratio associated with the first resistance/second resistance.

In accordance with an aspect of the disclosed subject matter, a WL band gap component 212 can provide a reference voltage to a WL regulator component 206 to facilitate generation of a WL voltage that can be supplied to a desired WL(s) in the memory array 104 in the memory 102, during a programming operation. A WL band gap regulator component 214 that can be included in the WL band gap component 212 can facilitate controlling the reference voltage level based on a desired operating temperature slope level (e.g., positive operating temperature slope level) to facilitate supplying a desired voltage level to a desired WL(s). The reference voltage output from the WL band gap component 212 can be received by the WL regulator component 206. The WL regulator component 206 can include a capacitor divider (not shown), comparator component (not shown), and a shunt metal-oxide semiconductor (MOS) (not shown). The WL regulator component 206 also can receive a voltage from a voltage generator 210 and can supply that voltage to a capacitor divider to facilitate generating a voltage level at the output of the capacitor divider. The WL regulator component 206 can facilitate regulating a WL voltage (e.g., voltage supplied to a WL(s)) as the comparator component included therein can compare the voltage level output from the capacitor divider with the reference voltage level, where the current associated therewith can be shunt to ground.

A WL voltage can be generated, where the level of the generated WL voltage can be determined based on the reference voltage level and/or the voltage level generated at the output of the capacitor divider. For example, when the voltage level output from the capacitor divider is equal to the reference voltage level, a WL voltage level can be generated, where such voltage level can be determined based on the voltage level at the capacitor divider, and such generated WL voltage level can be provided to a WL(s). The WL voltage level generated by the WL regulator component 206 to be provided to the respective WL can be significantly higher than the voltage level of the reference voltage and/or the voltage at the output of the capacitor divider.

In accordance with another aspect of the disclosed subject matter, a desired BL voltage level, which can be based on a desired operating temperature slope level (e.g., positive operating temperature slope level), can be generated and provided to a desired BL(s) in the memory array 104 in the memory 102, during a programming operation. This can be accomplished in a manner similar to that of generating a WL voltage, as described hereinabove. The BL band gap component 216 can provide a reference voltage to a BL regulator component 208. The BL regulator component 208 can include a capacitor divider (not shown), comparator component (not shown), and a MOS (not shown). A voltage generator 210 can supply a voltage to the BL regulator component 208 can be applied to the capacitor divider to facilitate generating a voltage level at the output of the capacitor divider. The voltage level at the output of the capacitor divider can be compared to the reference voltage. When the voltage level at the output of the capacitor divider is equal to the reference voltage, a BL voltage level based on the voltage level at the capacitor divider can be supplied to the desired BL(s) in the memory array 104. The BL voltage level generated by the BL regulator component 208 to be provided to the respective BL can be significantly higher than the voltage level of the reference voltage and/or the voltage at the output of the capacitor divider.

Figure 3:
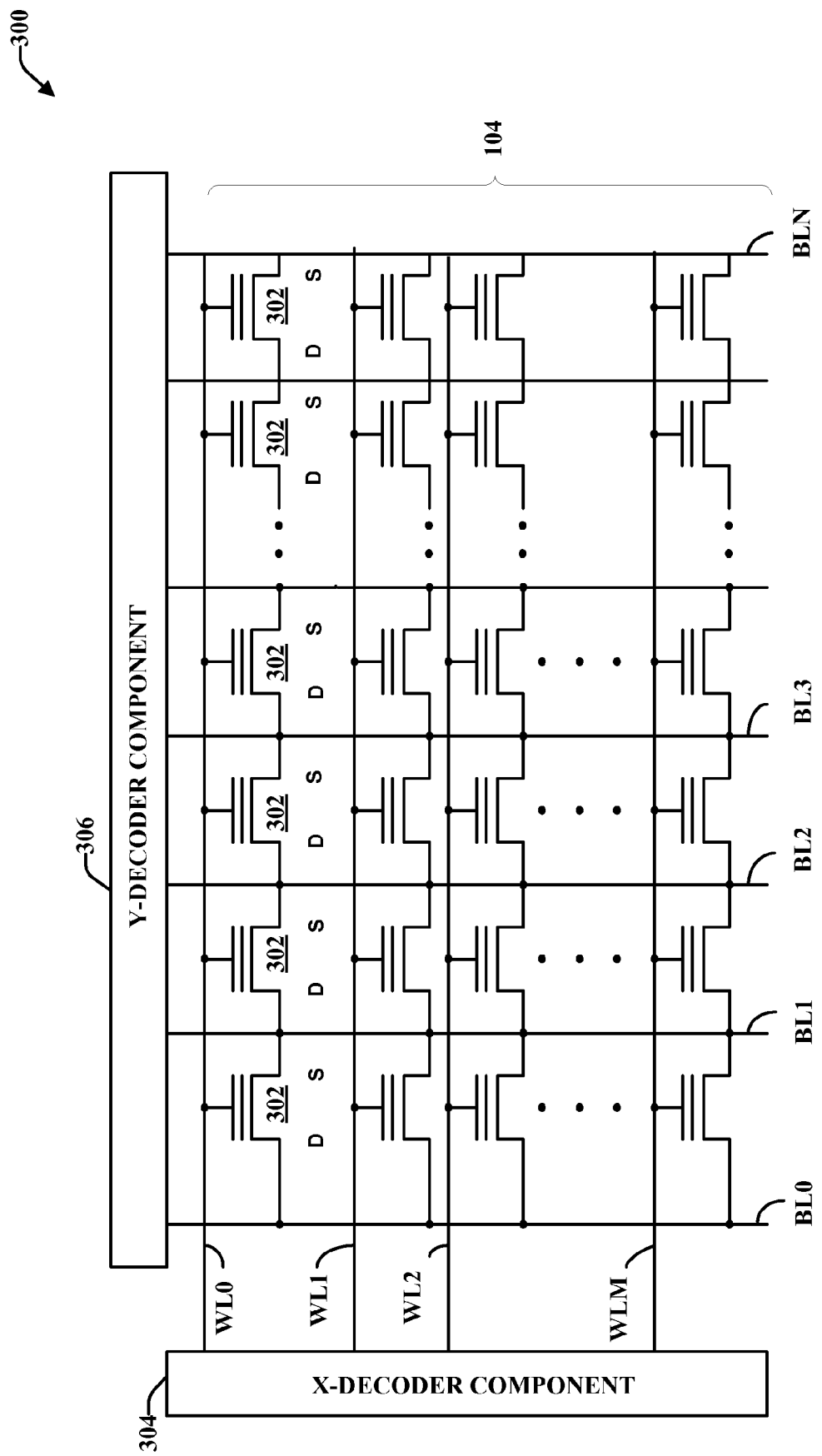
FIG. 3 illustrates an example diagram of a memory array associated with a memory device in accordance with an aspect of the disclosed subject matter.

Referring to FIG. 3, an example diagram 300 of a memory array in a memory device in accordance with the disclosed subject matter is illustrated. The diagram 300 of the memory array 104 (e.g., core) can include a plurality of memory cells 302 that each can be comprised of a drain, gate, and source. The memory array 104 can be included in a memory 102 (not shown in its entirety). The system 300 can include an X-decoder component 304 (e.g., WL decoder) and a Y-decoder component 306 (e.g. BL decoder) that can each respectively decode inputs/outputs during various operations (e.g., programming, reading, verifying, erasing) that can be performed on the memory cells 302. The X-decoder component 304 and Y-decoder component 306 can each receive address bus information from a system controller (not shown) or the like. The memory cells 302 can be formed in M rows and N columns. A common WL can be attached to the gate of each memory cell 302 in a row, such as word-lines WL0, WL1, WL2, through WLM. A common BL can be attached to each cell 302 in a column, such as bit-lines BL0, BL1, through BLN. A WL can contain, for example, 1024 elements forming multiple words and a sector can include, for example, 512 WLs to provide 512K elements of memory.

In accordance with an aspect of the disclosed subject matter, respective voltages can be applied to one or more cells 302 through the WLs and BLs to facilitate performing operations, such as program, read, and the like. The programming speed of the memory 102 can be based in part on the voltage levels respectively provided to the WLs and BLs during the program operation. The voltage level applied to a particular WL or BL can be based on a reference voltage that can be utilized to regulate the voltage supplied to the particular WL or BL, where the reference voltage can be based on an operating temperature slope associated with the memory device 102, for example.

Figure 4:
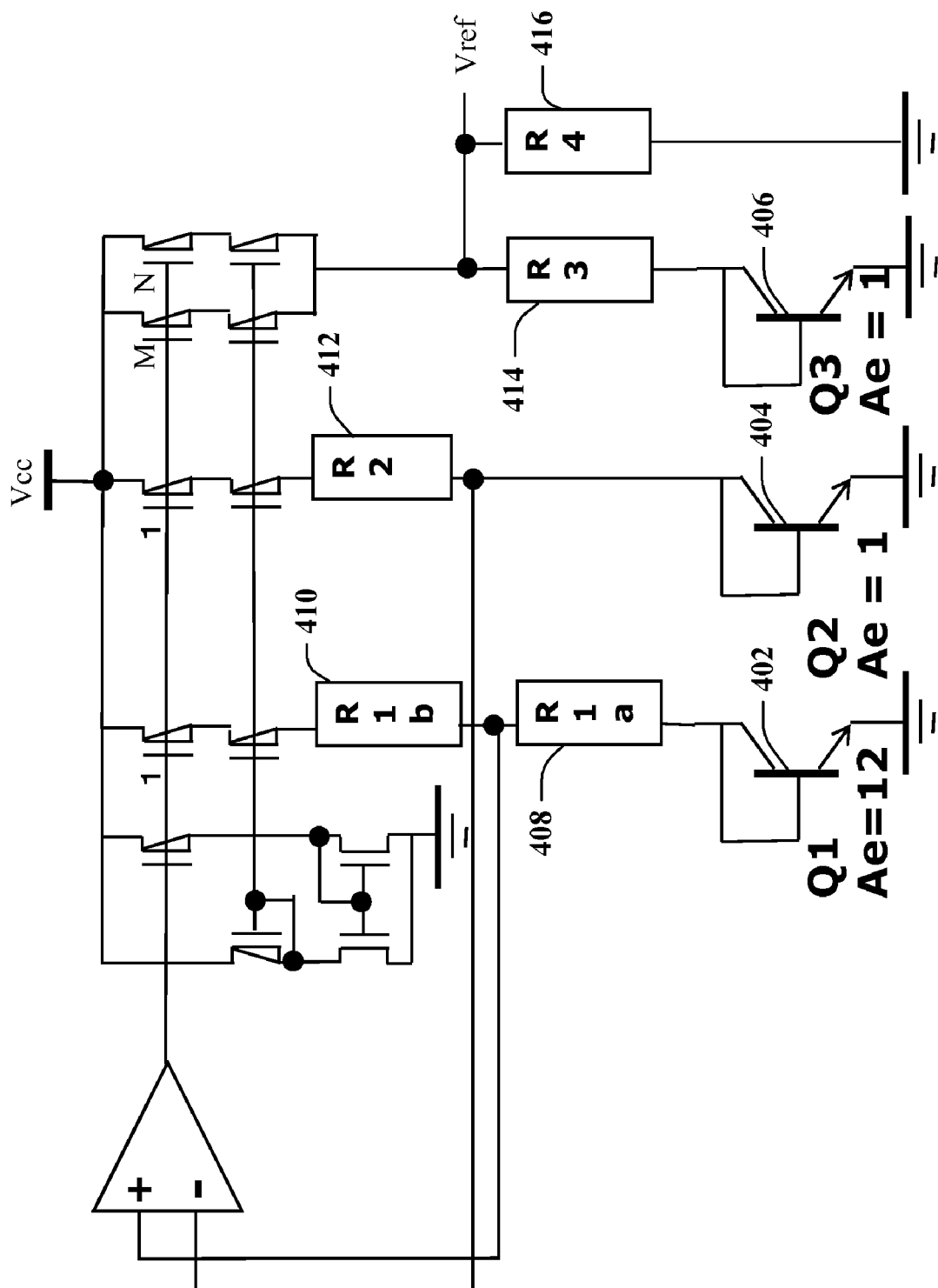
FIG. 4 illustrates an example of a system that employs a band gap circuit that facilitates regulation of a band gap reference voltage to facilitate program operations in a memory in accordance with an aspect of the disclosed subject matter.

Turning to FIG. 4, illustrated is an example diagram of a system 400 comprising a band gap circuit that can be associated with and/or included in a WL band gap component (e.g., 212) and/or BL band gap component (e.g., 216) and can facilitate regulation of a band gap reference voltage to facilitate program operations in a memory in accordance with an aspect of the disclosed subject matter. The band gap reference voltage can be provided to a WL regulator component (e.g., 206) and/or a BL regulator component (e.g., 208), where a particular WL regulator component can utilize the reference voltage to facilitate supplying a voltage to a WL associated therewith where such voltage can correspond to the reference voltage, and/or where a particular BL regulator component can utilize the reference voltage to facilitate supplying a voltage to a BL associated therewith where such voltage can correspond to the reference voltage.

The band gap circuit can receive a high voltage (e.g., $V_{cc}$). The band gap circuit can also include three bipolar junction transistor (BJT) components 402, 404, and 406. In accordance with one embodiment of the disclosed subject matter, the first BJT component 402 can have an emitter area of 12, the second BJT component 404 can have an emitter area of 1, and the third BJT component 406 can have an emitter area of 1. The band gap circuit can further include certain resistors, $R_{1a}$ 408 and $R_{1b}$ 410 that can be associated with the first BJT component 402, and $R_2$ 412, which can be associated with the second BJT component 404. To facilitate controlling the operating temperature slope and correspondingly the reference voltage, another resistor component $R_3$ 414 can be associated with the third BJT component 406 between the third BJT component 406 and the output, which can be the reference voltage, $V_{ref}$. Increasing the value of $R_3$ 414 can facilitate increasing the level of $V_{ref}$, and the operating temperature slope. Conversely, decreasing the level of $R_3$ 414 can facilitate decreasing $V_{ref}$ as well as decreasing the operating temperature slope.

As $V_{ref}$ is increased by increasing the value of $R_3$ 414, the current level associated with $V_{ref}$ can also be correspondingly increased or offset, which can be undesirable, as that can result in an undesired excess voltage being applied to components (e.g., WL, BL, associated memory cell(s)) in the memory (e.g. 102), which can cause components in the memory to breakdown and/or operation errors. To counter the offset in the current level associated with $V_{ref}$ due to an increase in $R_3$ 414 and facilitate controlling such current level, the band gap circuit also can include another resistor $R_4$ 416 that can be in parallel with $R_3$ 414. The value of $R_4$ 416 can be based on or a function of the value of $R_3$ 414. In one aspect, the ratio of the value of $R_3$ 414 divided by the value of $R_4$ 416 can facilitate determining the level of current offset associated with $V_{ref}$. For example, as $R_3$ 414 increases, $V_{ref}$ can correspondingly increase. The value of $R_4$ 416 can be decreased to facilitate controlling (e.g., decreasing) the current level associated with $V_{ref}$.

In accordance with one embodiment of the disclosed subject matter, $V_{ref}$ can be calculated in accordance with the following equation:

$$V_{ref} = \frac{(M+N)}{(1+R3/R4)} n \frac{(kT)}{q} [\ln 12] \frac{R3}{R1a} + \frac{Vbe3}{[1+R3/R4]}$$

where the values for M (e.g., M=2), N (e.g., N=2), Vbe3 can be the voltage across the base and element of the third BJT component 406, and $R_{1a}$ (e.g. 408) can be fixed, and n can be an ideality factor associated with the P-N junction and can typically have a value between 1.0 and 1.2. Values for $R_3$ 414 and $R_4$ 416 can be selected based on the desired $V_{ref}$, desired operating temperature slope level, and/or a desired counter to the current offset due to increasing $R_3$ 414, where the resistance level of $R_3$ 414 can be increased to facilitate increasing the voltage level of $V_{ref}$.

In accordance with an aspect of the disclosed subject matter, where the system 400 is being utilized to facilitate WL regulation, a WL band gap regulator component 214 (see FIG. 2) can be included in a WL band gap component 212 (see FIG. 2) that can include a band gap circuit as described in system 400. The WL band gap regulator component 214 can be comprised of $R_3$ 414 and $R_4$ 416. For example, $R_3$ 414 can be a first resistance that can facilitate controlling the operating temperature slope and/or reference voltage, and $R_4$ 416 can be a second resistance that can facilitate controlling the current level associated with the reference voltage.

In accordance with another aspect of the disclosed subject matter, where the system 400 is being employed to facilitate BL regulation, a BL band gap regulator component 218 (see FIG. 2) can be included in a BL band gap component 216 (see FIG. 2) that can include a band gap circuit as described in system 400. The BL band gap regulator component 218 can be comprised of $R_3$ 414 and $R_4$ 416. For example, $R_3$ 414 can be a first resistance that can facilitate controlling the operating temperature slope and/or reference voltage, and $R_4$ 416 can be a second resistance that can facilitate controlling the current level associated with the reference voltage.

Figure 5:
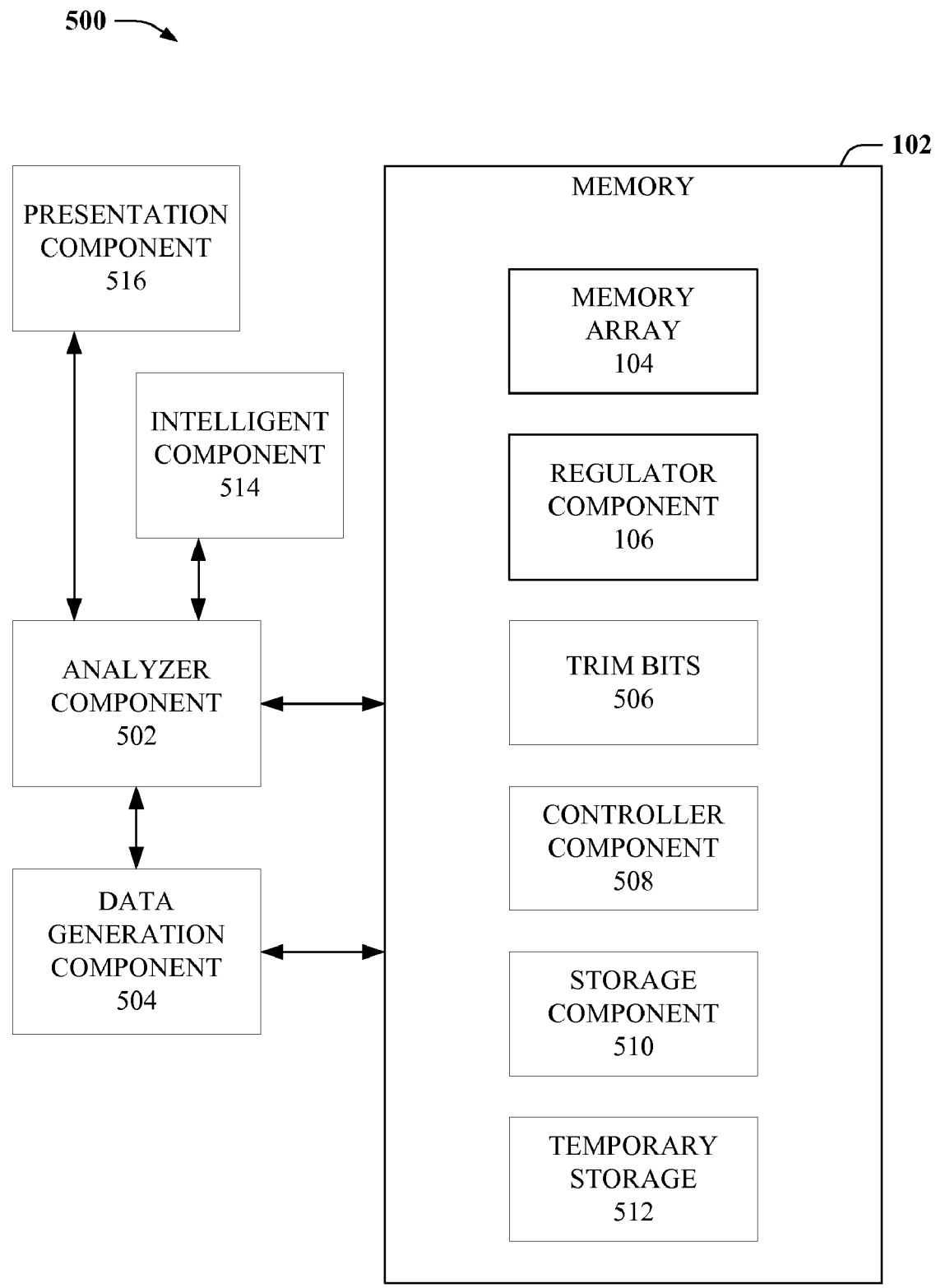
FIG. 5 depicts a block diagram of a system that employs intelligence to facilitate execution of operations associated with a memory in accordance with an aspect of the disclosed subject matter.

FIG. 5 depicts a system 500 that can employ intelligence to facilitate execution of operations in a memory device in accordance with an aspect of the disclosed subject matter. The system 500 can include the memory 102, memory array 104, regulator component 106, and/or other components, wherein it is to be appreciated that such components can be substantially similar to respective components described with regard to system 100, system 200, system 300, and/or system 400.

The system 500 can further include an analyzer component 502 that can receive information regarding the memory 102, including information regarding the transistor characteristics of the memory cells 302 in memory 102, to facilitate determining a desired or optimal $V_{ref}$ and/or a desired or optimal operating temperature slope level (e.g., positive temperature slope level) to facilitate improving or increasing the programming speed of the memory 102.

The analyzer component 502 can be associated with a data generation component 504 that can facilitate generating trim bit data based on the analyzed information, where the trim bit data can facilitate selection of trim bits 506 in the memory 102 in order to facilitate setting values for $R_3$ (e.g., 414) (see, e.g., FIG. 4) and $R_4$ (e.g. 416) (see, e.g. FIG. 4) and thereby facilitate setting a desired or optimal $V_{ref}$ and/or desired or optimal operating temperature slope. The data generation component 504 can be associated with suitable software (not shown) that can facilitate interacting/interfacing with a controller component 508 in the memory 102. The trim bits 506 can facilitate controlling the respective resistance values of $R_3$ and/or $R_4$ where, for example, $R_3$ and/or $R_4$ each can be respectively comprised of one or more resistors in series. For example, setting a trim bit to low can short out a particular resistor in the $R_3$ series chain to facilitate reducing the resistance level, and conversely, setting a trim bit to high can facilitate increasing the resistance level in the series chain, as described more fully herein.

The memory 102 can further include a controller component 508 that can facilitate receiving trim bit data into the memory 102 from the data generation component 504, where the controller component 508 can store the trim bit data in a storage component 510, which can be one or more memory cells in the memory 102. The controller component 508 can also facilitate reading the trim bit data from the storage component 510 during power up (or boot up) operations and can store the trim bit data in a temporary storage component 512, where such data can be utilized by the controller component 508, a WL band gap component 212 (see FIG. 2), and/or a BL band gap component 216 (see FIG. 2).

In accordance with one embodiment of the disclosed subject matter, the memory 102 can utilize a desired number of trim bits 506 (e.g. two trim bits) to facilitate selecting the respective resistors in each of the $R_3$ series chain and the $R_4$ series chain to facilitate controlling the reference voltage and the current level associated therewith. The resistance level of the $R_3$ series chain can be such that it corresponds with, or substantially corresponds with, the desired or optimal operating temperature slope associated with the memory 102. The resistance level of the $R_4$ series chain can be such that it corresponds with, or substantially corresponds with, the desired or optimal current level associated with the reference voltage. The trim bits 506 can facilitate adjusting the operating temperature slope by 10 mV/130° C. per each trimming step. For example, the following tables can illustrate the selection of trim bits 506, where, for example, two trim bits are employed, based on a binary value and operating temperature slope based on such binary value.

TABLE 1

| TRIM_PBLSLOPE [1:0] | TRPBTC [2] | TRPBTC [1] | TRPBTC [0] |
|---|---|---|---|
| 10 - 64 mV/130° C. | H | H | H |
| 11 - 50 mV/130° C. | L | H | H |
| 01 - 38 mV/130° C. | L | L | H |
| 00 - 30 mV/130° C. | L | L | L |

As can be seen in Table 1, with all of the control signals (e.g., TRPBTC[2], TRPBTC[1], TRPBTC[0]) associated with the $R_3$ series chain set to H (e.g., high) at binary value 10, all resistors in the $R_3$ series chain can be employed to facilitate increasing the value of $R_3$, and can thereby facilitate increasing the operating temperature slope and correspondingly the level of $V_{ref}$. As the values of the signals associated with the $R_3$ series chain are set to low, the particular resistor(s) associated with the respective signal(s) can be shorted out (e.g., control signal is Low) with enhancement p-channel metal-oxide-semiconductor field-effect transistors (PMOSs) based on the trim slope settings in the table to facilitate reducing the value of $R_3$, which can correspondingly decrease the operating temperature slope and $V_{ref}$. The current level associated with $V_{ref}$ can be controlled in accordance with the following table:

TABLE 2

| TRIM_PBLSLOPE [1:0] | TRPBTC [2] | PBVTCBB1 |
|---|---|---|
| 10 | H | H |
| 11 | L | H |
| 01 | L | L |
| 00 | L | L |

As can be seen from Table 2, with all of the control signals (e.g. TRPBTC[2], PBVTCBB1) set to H, the resistors associated with the R series chain can be shorted using n-type metal-oxide-semiconductor field-effect transistors (NMOSs) to increase the $R_3/R_4$ ratio and facilitate decreasing the current level associated with $V_{ref}$. As the control signals are set to low, the value of $R_4$ can be increased as the resistors in the $R_4$ series chain can be unshorted, and the current level associated with $V_{ref}$ can be correspondingly increased.

As can be seen from Tables 1 and 2, with a binary value of 10, for example, the resistors associated with the $R_3$ series chain can all be unshorted thereby increasing the value of $R_3$ and increasing the level of $V_{ref}$. As further result, a positive operating temperature slope of 64 mV/130° C. can be achieved. Further, the resistors associated with the $R_4$ series chain can be shorted to facilitate reducing the current level associated with $V_{ref}$.

It is to be appreciated that, while the above example employs two trim bits, the subject innovation is not so limited, and any desired number of trim bits can be employed to facilitate determining of resistance values and regulating the reference voltage and associated current, in accordance with the disclosed subject matter.

In accordance with an aspect of the disclosed subject matter, the analyzer component 502 can be associated with an intelligent component 514. The intelligent component 514 can be utilized by the analyzer component 502 to facilitate analyzing data and/or generating inferences to facilitate determining a reference voltage; determining a current associated with a reference voltage; determining an operating temperature slope; determining an optimal $V_{ref}$ associated current level, and/or operating temperature slope; determining characteristics of the memory device during operations, including transistor characteristics associated with memory cells in the memory device; determining a programming speed based on an operating temperature slope; etc.

For example, the intelligent component 514 can infer a programming speed of a memory device based on, for example, the transistor characteristics of the memory cells in the memory device, the reference voltage, and/or the operating temperature slope.

It is to be understood that the intelligent component 514 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, $x=(x1, x2, x3, x4, xn)$, to a confidence that the input belongs to a class, that is, $f(x)=confidence(class)$. Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

System 500 can further utilize a presentation component 516 that provides various types of user interfaces to facilitate interaction between a user and any component coupled to the analyzer 502 and/or memory 102. As depicted, the presentation component 516 is a separate entity that can be utilized with the analyzer component 502. However, it is to be appreciated that the presentation component 516 and/or similar view components can be incorporated into the analyzer component 502 and/or a stand-alone unit. The presentation component 516 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled and/or incorporated into the analyzer component 502.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

System 500 can facilitate adjusting the temperature compensation factor (e.g., temperature slope) during various stages of construction and/or testing of the memory device 102, including during the silicon characterization stage, as employing trim bit options can facilitate adjustment of the temperature compensation factor. As a result, there can be a reduction in mask revision change and/or an improvement in producing the product. Further, the subject innovation can increase operating speed (e.g., programming speed) and/or improve accuracy of the memory device 102, as by fine-tuning the temperature compensation value (e.g. controlling the temperature slope), programming speed can be maintained constant across temperature, even where a transistor can be "weak" at "hot" temperature (e.g. during programming operation). Further, the subject innovation can improve reliability of the memory 102, as accurate temperature compensation, that is, accuracy in controlling $V_{ref}$ and the current associated therewith, is desirable and can reduce the risk of overcompensation, as overcompensation can result in over programming at "hot" which can cause wider Vt distribution programming bits as well as other reliability issues.

Figure 6:
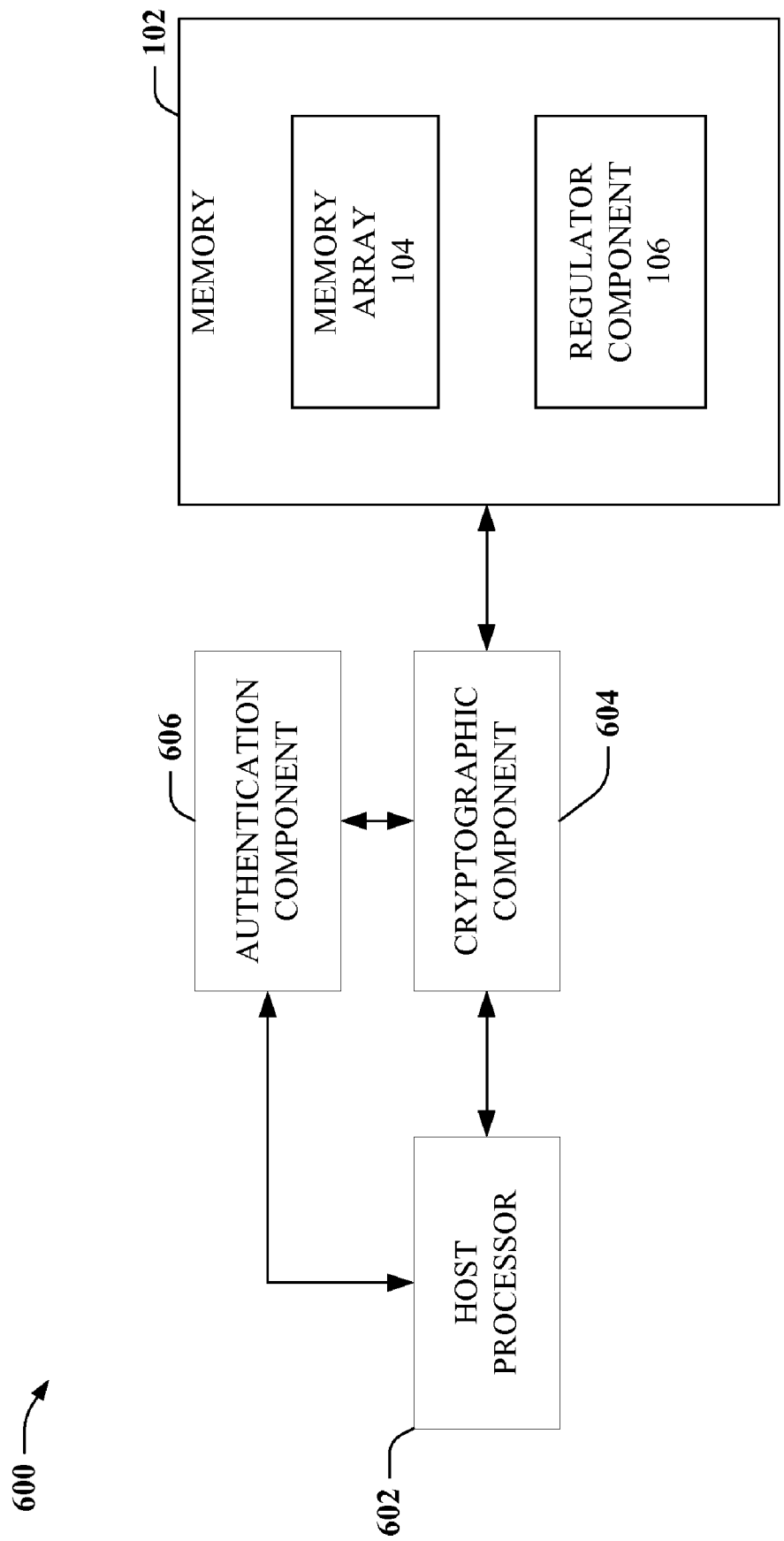
FIG. 6 illustrates a block diagram of a system that facilitates execution of operations in a memory in accordance with an aspect of the disclosed subject matter.

Referring to FIG. 6, illustrated is a system 600 that facilitates execution of operations in a memory device in accordance with an aspect of the disclosed subject matter. The system 600 can include the memory 102, memory array 104, regulator component 106, and/or other components, wherein it is to be appreciated that such components can be substantially similar to respective components described herein, for example, with regard to, for example, system 100, system 200, system 300, system 400, and/or system 500.

System 600 also can include a host processor 602, which can be a typical applications processor that can manage communications and run applications. For example, the host processor 602 can be a baseband processor for a mobile handset, personal data assistant (PDA), or the like. The host processor 602 can be associated with a cryptographic component 604 that can facilitate encrypting/decrypting data and/or generating a digital signature.

In accordance with an aspect of the disclosed subject matter, cryptographic component 604 can provide symmetric cryptographic tools and accelerators (e.g. Twofish, Blowfish, AES, TDES, IDEA, CAST5, RC4, etc.) to ensure that a specified partition in memory component 102, or portions thereof, can only be accessed by those entities authorized and/or authenticated to do so. The cryptographic component 604 also can provide asymmetric cryptographic accelerators and tools (e.g., RSA, Digital Signature Standard (DSS), and the like) to ensure that a specified partition in memory 102, or portions thereof, are only accessed by those entities that are authorized and certified to do so. Additionally, cryptographic component 604 can provide accelerators and tools (e.g., Secure Hash Algorithm (SHA) and its variants such as, for example, SHA-0, SHA-1, SHA-224, SHA-256, SHA-384, and SHA-512) to ensure that access to the specified partition in memory 102 is confined to those entities authorized to gain access.

System 600 can further include an authentication component 606 that can solicit authentication data from an entity, and, upon the authentication data so solicited, can be employed, individually and/or in conjunction with information acquired and ascertained as a result of biometric modalities employed, to facilitate control access to the memory 102. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by authentication component 606. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authentication component 606 can implement one or more machine-implemented techniques to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity.

In accordance with one aspect of the disclosed subject matter, system 600, system 500, system 400, system 300, system 200, and/or system 100, or portions thereof, can be included in various electronic devices, such as a computer, a personal digital assistant (PDA), a cellular phone, a digital phone, an answering machine, a video device (e.g., television, or digital versatile disk (DVD) player/recorder), a music player/recorder (e.g., compact disc (CD) player, MP3 player), a digital recorder, a digital camera, a microwave oven, an electronic organizer, an electronic toy, an electronic game, a scanner/reader, and the like, as well as other peripheral devices (e.g., printer) or other electronic devices (e.g., a copy machine, a facsimile machine) that include a memory component.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

FIGS. 7-11 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 7:
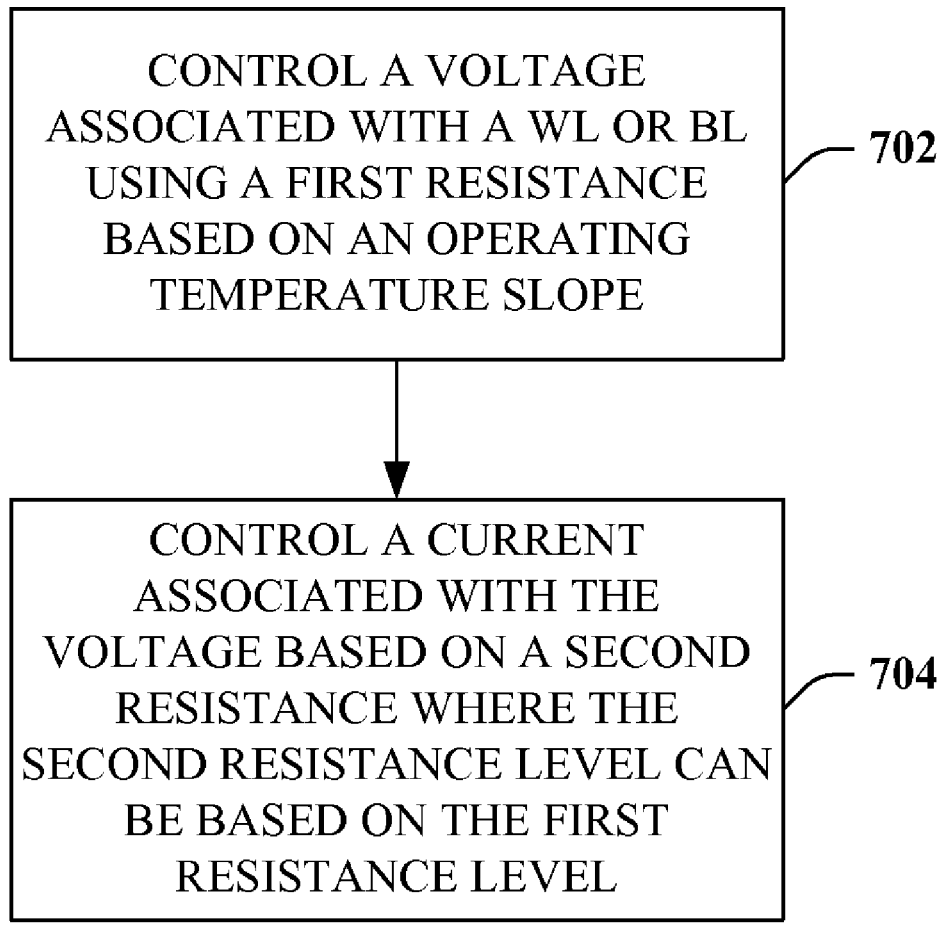
FIG. 7 illustrates a methodology that facilitates controlling a reference voltage to facilitate programming data in a memory in accordance with an aspect of the subject matter disclosed herein.

Referring to FIG. 7, illustrated is a methodology 700 that can facilitate controlling a reference voltage to facilitate programming data in a memory in accordance with an aspect of the disclosed subject matter. At 702, a voltage (e.g. $V_{ref}$)

associated with a WL and/or BL can be controlled using a first resistance level that can be based on an operating temperature slope associated with the memory device (e.g., 102). The voltage, $V_{ref}$, can be utilized to facilitate regulating a voltage that can be supplied to a WL and/or BL in the memory. In accordance with an aspect of the disclosed subject matter, one or more resistors can be utilized to generate the first resistance level, where the total level of resistance can be based on a desired and/or optimal operating temperature slope associated with a memory device. The first resistance can be utilized to control the voltage level in the band gap circuit associated with a band gap component, where the voltage can be a reference voltage (e.g., $V_{ref}$) that can be provided to a WL regulator component (e.g., 206) or BL regulator component (e.g., 208) to facilitate supplying a desired regulated voltage based on the operating temperature slope to the respective WL and/or BL that can be associated with a memory array (e.g., 104). Data can be written to a desired memory location (e.g., memory cell) based on the respective voltages applied to a WL and/or BL associated with the memory locations.

In accordance with an aspect, the operating temperature slope can be increased to facilitate increasing the reference voltage during a programming operation to facilitate increasing the speed of programming operations in the memory. The transistors associated with the memory cells in the memory can be "weaker" at "hot" temperature, such as during a programming operation, due to the nature of the transistor. As a result, a reference voltage based on a flat temperature slope can result in the programming speed being reduced and correspondingly the amount of time to execute a programming operation can be increased. The subject innovation can facilitate employing a positive temperature slope to facilitate increasing the reference voltage that can be utilized during programming operations to facilitate increasing the voltage levels supplied to a WL and/or BL and can thereby facilitate countering or reducing the impact of the "weakness" of the transistors at "hot" temperature and increase the programming speed.

At 704, a current associated with the reference voltage can be controlled based on a second resistance, where the level of the second resistance can be based on or a function of the first resistance level. In accordance with one aspect of the disclosed subject matter, one or more resistors can be employed to facilitate generating the second resistance level, and the current can be controlled as a function of the ratio of the first resistance level divided by the second resistance level. For example, when the first resistance level is increased, and correspondingly the operating temperature slope is increased, the second resistance level can be decreased to facilitate controlling (e.g., decreasing) the current associated with the reference voltage. When the first resistance level is reduced, which can correspondingly reduce the operating temperature slope, the second resistance level can be increased to facilitate increasing the current level associated with the reference voltage.

The current can be controlled in order to facilitate countering an offset in the current associated with the reference voltage that can be caused by increasing the band gap reference voltage based on an operating temperature slope. At this point, methodology 700 can end.

Figure 8:
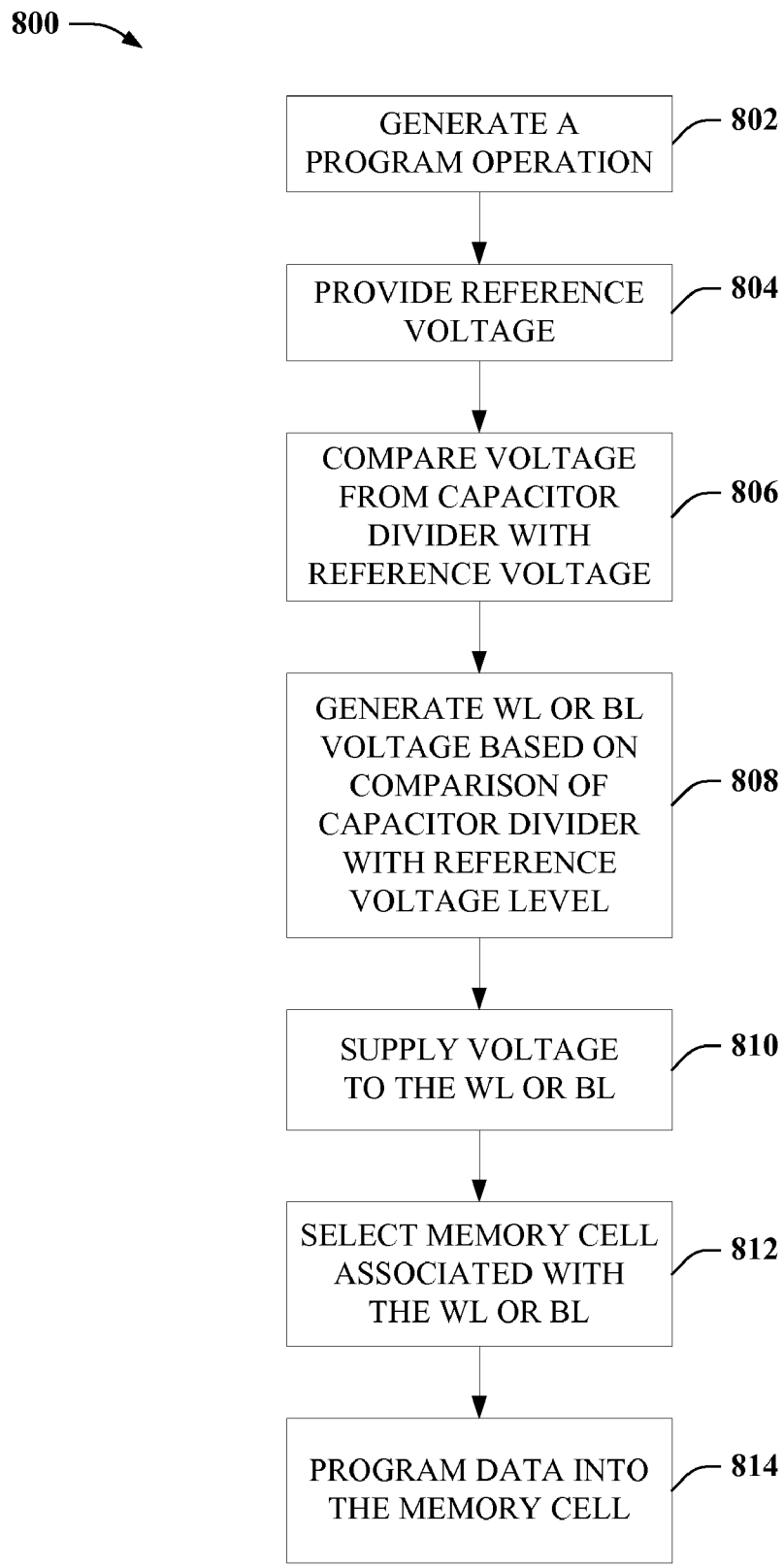
FIG. 8 illustrates a methodology that facilitates programming data into a memory in accordance with an aspect of the disclosed subject matter.

Turning to FIG. 8, is a methodology 800 that can facilitate programming data in a memory in accordance with an aspect of the subject matter disclosed herein. At 802, an operation, for example, a program operation, can be generated. In accordance with an aspect of the disclosed subject matter, the operation can be generated by a host processor (e.g. 602). The operation or command can include information regarding the data to be written to the memory 102, the memory address(es) associated with memory location(s) in the memory 102 to which the data is to be written, and other information to facilitate performing the programming of data to the desired memory location(s). At 804, a reference voltage (e.g., $V_{ref}$) can be provided. For example, a reference voltage from the band gap circuit can be provided to a WL regulator component (e.g., 206) or a BL regulator component (e.g., 208). The reference voltage can be supplied to a comparator component (not shown) with the respective WL regulator component or BL regulator component to facilitate generating a WL voltage or BL voltage.

At 806, the level of the reference voltage can be compared to a voltage level that can be output from a capacitor divider (not shown) within the respective WL regulator component or BL regulator component. For example, a WL regulator component (or BL regulator component) can include a capacitor divider, comparator component, and a shunt metal-oxide semiconductor (MOS) (not shown). The WL regulator component (or BL regulator component) can receive a voltage from a voltage generator and can apply that voltage to a capacitor divider to facilitate generating a voltage level at the output of the capacitor divider. The WL regulator component (or BL regulator component) can facilitate regulating a WL voltage (or BL voltage) by comparing the voltage from the capacitor divider with the reference voltage, where the current can be shunt to ground.

At 808, a WL voltage, where associated with a WL, or BL voltage, where associated with a BL, can be generated, where the level of the generated WL (or BL) voltage can be determined based on the reference voltage level and/or the voltage level generated at the output of the capacitor divider. For example, when the voltage level output from the capacitor divider is equal to the reference voltage level, a voltage level can be generated, where such voltage level can be determined based on the voltage level at the capacitor divider, and such generated voltage level can be provided to a WL if associated with a WL, or a BL if associated with a BL. The voltage level generated by the WL regulator component (or BL regulator component) to be provided to the respective WL (or BL) can be significantly higher than the voltage level of the reference voltage.

At 810, the generated WL and/or BL voltage can be supplied to an associated WL and/or BL, where the supplied voltage can be determined based on the reference voltage. At 812, a memory cell(s) associated with a WL(s) and/or BL(s) can be selected. At 814, the data associated with a programming operation can be written to the selected memory cell(s). The programming speed can be based on the voltage level supplied to the WL and/or BL, and such voltage level can be based on the operating temperature slope associated with the reference voltage. That is, an increase in the operating temperature slope level (e.g., positive operating temperature slope level) can result in a corresponding increase in the reference voltage, which can in turn result in a corresponding increase in the voltage supplied to a WL and/or BL and can thereby result in an increase in programming speed. At this point, methodology 800 can end.

Figure 9:
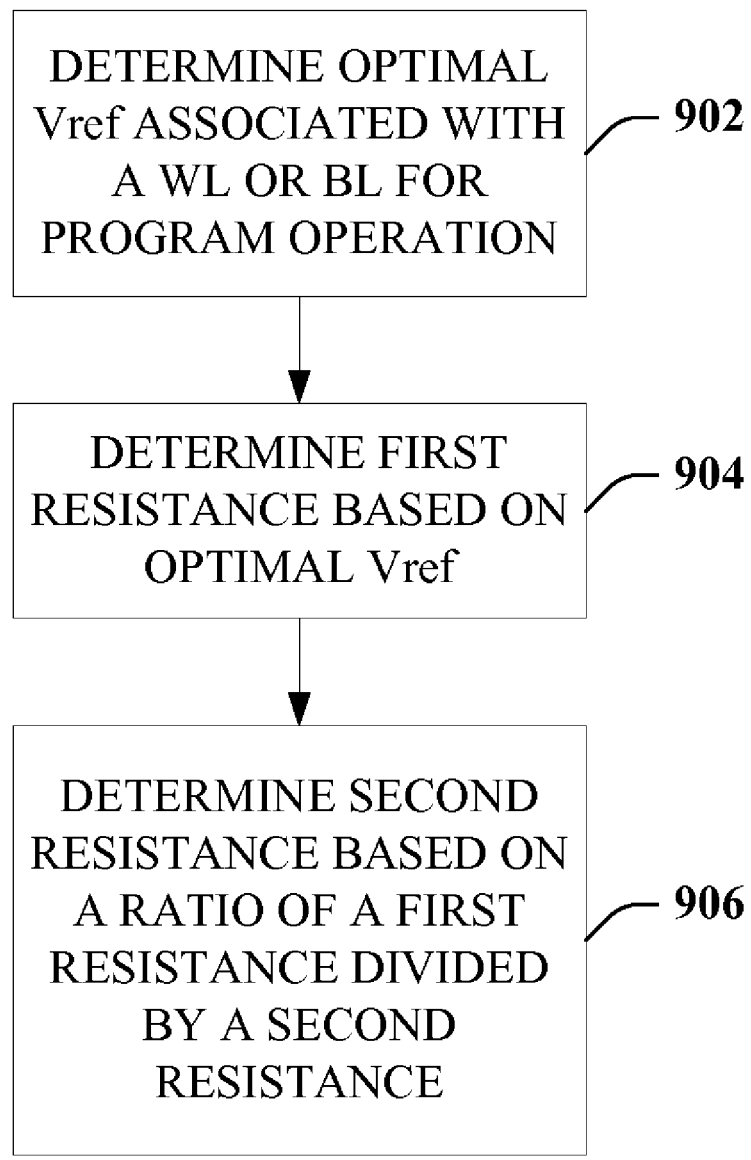
FIG. 9 depicts another methodology that facilitates controlling a reference voltage to facilitate programming data in a memory in accordance with an aspect of the subject matter disclosed herein.

Referring to FIG. 9, illustrated is a methodology 900 that can facilitate controlling a reference voltage to facilitate programming data in a memory in accordance with an aspect of the subject matter disclosed herein. At 902, a desired or optimal reference voltage (e.g., $V_{ref}$) can be determined, where the reference voltage can be associated with a WL and/or BL associated with an operation (e.g. program operation) that can be executed in the memory (e.g., 102). At 904, a first resistance level can be determined where the level of the first resistance can be based on the desired or optimal reference voltage. The first resistance level can be determined based on the levels of one or more resistors that can be in a series chain. The first resistance can be employed in the band gap circuit and can facilitate controlling the band gap reference voltage, as an increase in the level of the first resistance can result in the reference voltage level increasing. The increase in the first resistance level can result in a positive operating temperature slope that can be associated with the increase in the reference voltage. An increase in the reference voltage level can facilitate increasing the voltage level supplied to a WL and/or BL during an execution of an operation (e.g., program operation) in the memory. An increased voltage level during a programming operation can facilitate increasing the programming speed and can thus counter certain issues or characteristics associated with a transistor(s) associated with a memory location(s) in the memory, such as by countering the effects of a transistor(s) that can be "weaker" when at "hot" temperature during the programming operation.

At 906, a second resistance level can be determined, where the level or amount of the second resistance can be determined based on a ratio of the first resistance level divided by the second resistance level. The second resistance level can be determined based on the levels of one or more resistors that can be in a series chain and can be in parallel to the first resistance, and can be utilized to facilitate controlling a current level associated with the reference voltage in a band gap circuit. The current level can be controlled to minimize, reduce, and/or eliminate an offset in the current level due to the change (e.g., increase) in the reference voltage based on the first resistance. At this point, methodology 900 can end.

Figure 10:
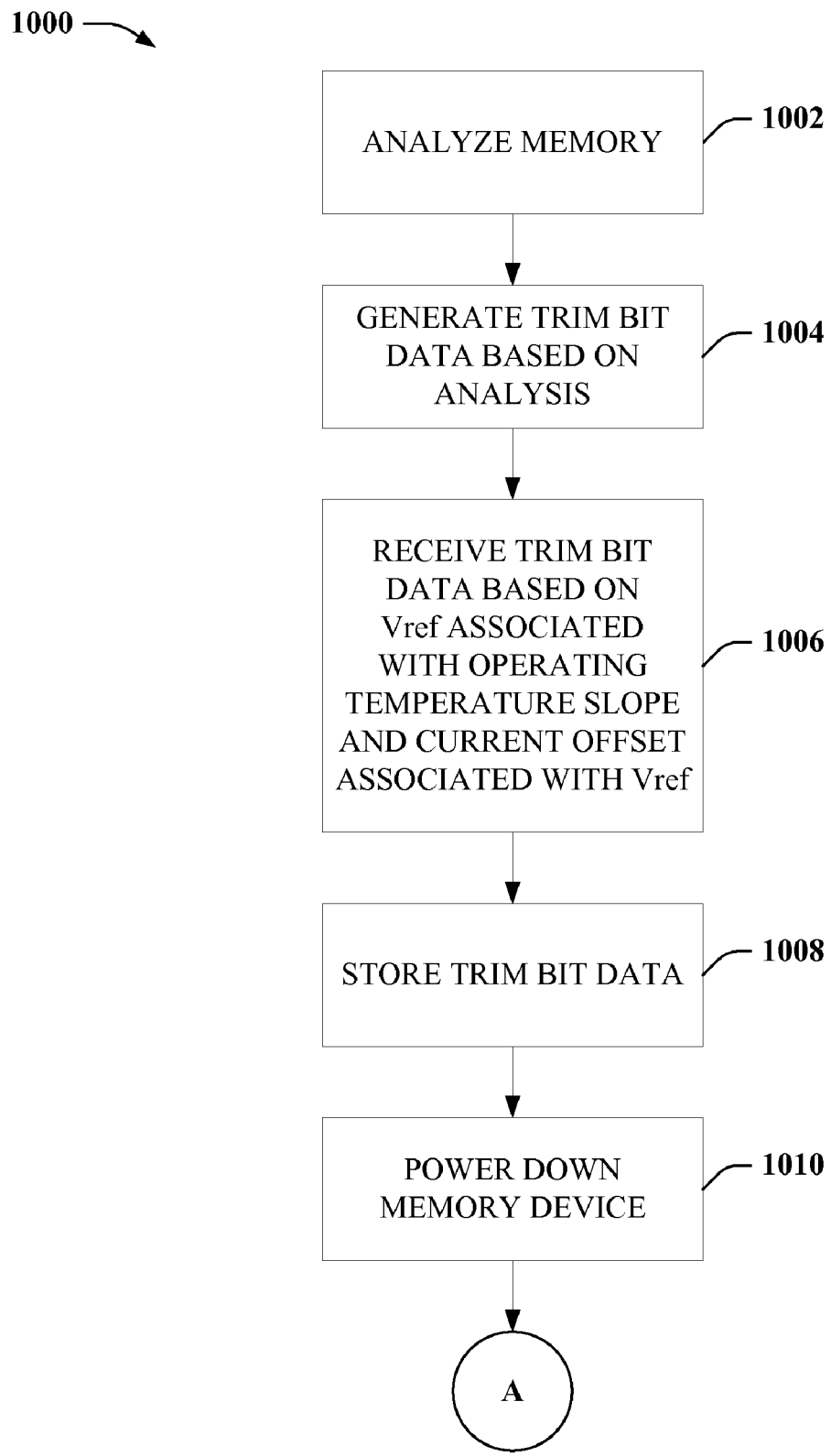
FIG. 10 illustrates a methodology that facilitates storing trim bit data in a memory to facilitate programming data in the memory in accordance with an aspect of the subject matter disclosed herein.

FIG. 10 illustrates a methodology 1000 that can facilitate storing trim bit data in a memory to facilitate programming data in the memory in accordance with an aspect of the disclosed subject matter. At 1002, a memory device can be analyzed. The memory can be analyzed, for example by an analyzer component (e.g., 502) to facilitate determining a desired or optimal reference voltage in order to facilitate increasing or improving the programming speed of the memory during execution off programming operations. For example, the transistors associated with memory locations (e.g., memory cells) in the memory can be analyzed to determine to what extent the transistors "weaken" or impact an operation (e.g. program operation) due to the characteristics of the transistors.

At 1004, trim bit data can be generated based on the analysis of the memory device. The trim bit data can include data associated with a first resistance that can be employed to facilitate controlling a reference voltage that can be in a band gap circuit. The trim bit data can also include data associated with a second resistance that can be employed to facilitate controlling a current level associated with the reference voltage in the band gap circuit. The trim bit data can be utilized to select or control trim bits that can be included in a memory device to facilitate adjusting respective resistance levels (e.g., first resistance, second resistance) to facilitate controlling the reference voltage and/or current level associated therewith. The trim bit data can also facilitate providing a positive operating temperature slope, as opposed to a conventional flat temperature slope, in order to improve programming speed by countering the negative impact on programming speed due to transistor characteristics, as transistors can be "weaker" at "hot" temperature (such as can be encountered during a programming operation) and can thereby impact the programming speed.

At 1006, the trim bit data can be received by the memory device. At 1008, the trim bit data can be stored, for example, in a non-volatile memory component in the memory device. In accordance with an aspect of the disclosed subject matter, the trim bit data can be stored in a storage component (e.g., 510, which can be comprised of one or more memory cells in the memory 102. At 1010, the memory device can be powered down. Methodology 1000 can proceed to point A. At this point, methodology 1000 can end.

Figure 11:
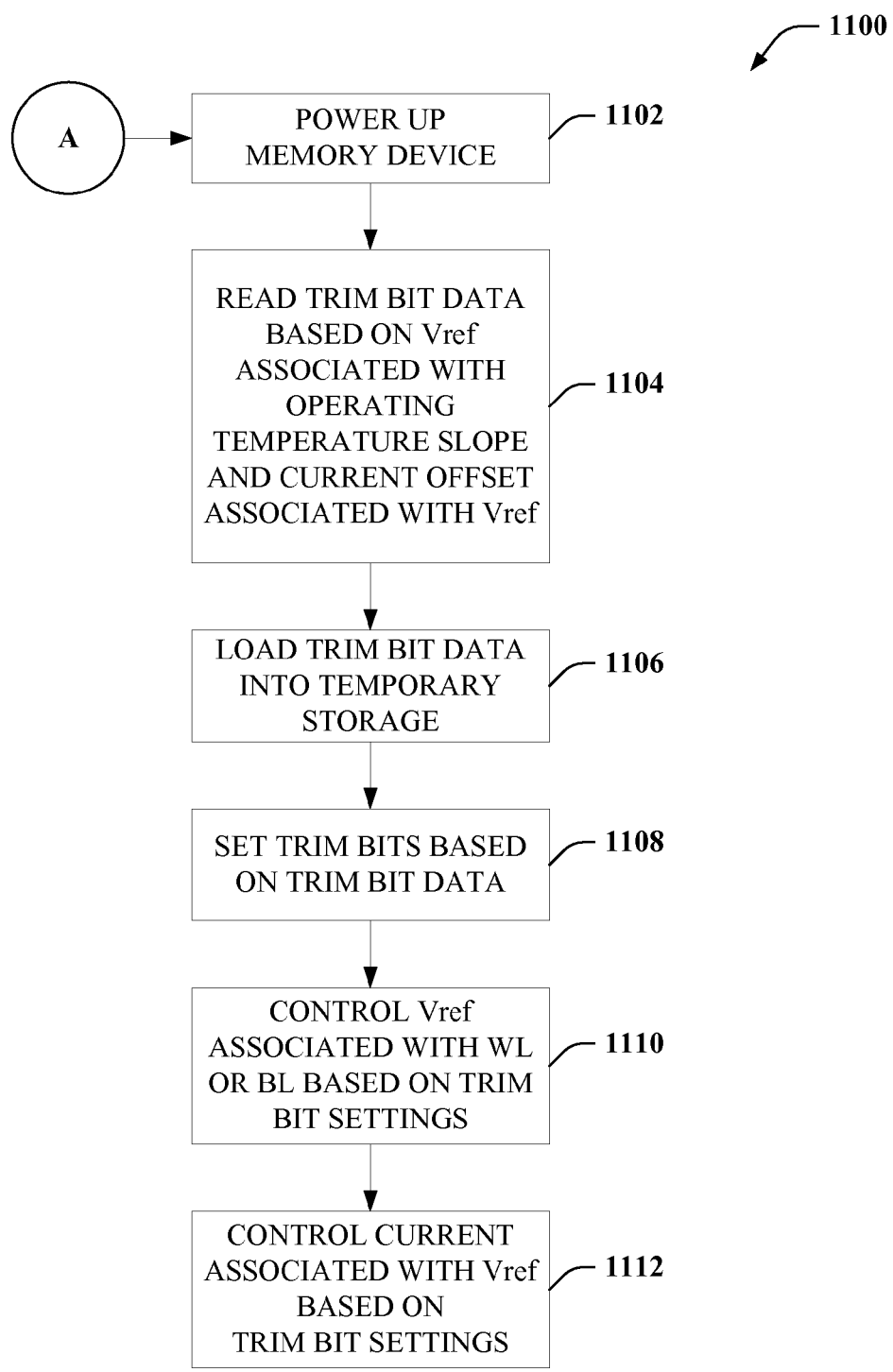
FIG. 11 illustrates a methodology that utilizes trim bit data to facilitate controlling a reference voltage to facilitate programming data in a memory in accordance with an aspect of the disclosed subject matter.

Referring to FIG. 11, depicted is a methodology 1100 that can utilize trim bit data to facilitate controlling a reference voltage to facilitate programming data in a memory in accordance with an aspect of the disclosed subject matter. In accordance with an aspect of the disclosed subject matter, methodology 1100 can begin from point A of methodology 1000. At 1102, the memory device can be powered up. At 1104, trim bit data can be read, for example, from a non-volatile storage component (e.g., 510) that can be included in the memory device. In accordance with an aspect of the disclosed subject matter, the trim bit data can be stored in the storage component, which can be comprised of one or more memory cells in the memory 102. The trim bit data can be associated with and/or based on a desired or optimal reference voltage that can be associated with an operating temperature slope (e.g., positive operating temperature slope), such that the trim bit data can be utilized to facilitate controlling the reference voltage. The trim bit data can also be associated with and/or based on a desired or optimal current level associated with the reference voltage in the band gap circuit such that the trim bit data can be employed to facilitate controlling the current level.

At 1106, the trim bit data can be stored or loaded, for example, in a temporary storage, which can be a volatile memory component (e.g., SRAM) (not shown) that can be included in the memory device. At 1108, the trim bits can be set or selected based on the trim bit data. The memory can include trim bits, for example, in each band gap component (e.g., 212, 216) to facilitate setting a first resistance level and/or a second resistance level in each band gap component. The trim bit data, or a portion thereof, can be utilized to facilitate setting the first resistance level, and/or another portion of the trim bit data can be utilized to facilitate setting the second resistance level.

At 1110, the reference voltage level can be controlled based on the trim bit settings associated with the first resistance. The reference voltage can be associated with a WL and/or BL in that the reference voltage can be employed to facilitate regulating a voltage supplied to a WL and/or BL. At 1112, a current level associated with the reference voltage can be controlled based on the trim bit settings associated with the first resistance and/or the second resistance. At this point, methodology 1100 can end.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates execution of operations in a memory, comprising:
   a regulation component that controls a reference voltage level associated with at least one of a word-line or a bit-line based at least in part on an operating temperature slope level associated with the memory to facilitate execution of operations in the memory;
   a memory array associated with the memory, the memory array includes a plurality of memory cells that are each respectively associated with a corresponding word-line and bit-line;
   an analyzer component that receives information relating to the memory to facilitate determining an optimal temperature slope level to be the operating temperature slope level associated with at least one type of operation;
   a data generation component that generates data associated with at least one trim bit; and
   a controller component that receives the data associated with the at least one trim bit and stores such data in a storage component, reads the data associated with the at least one trim bit when the memory is powered up and stores such data in a temporary storage where such data is used to facilitate selection of the at least one trim bit, the at least one trim bit is associated with at least one of the reference voltage or a current level.

2. The system of claim 1, the regulation component includes a first resistance that facilitates controlling at least one of the reference voltage level or the operating temperature slope level, such that, as the first resistance increases, there is a corresponding increase in the at least one of the reference voltage level or the operating temperature slope level.

3. The system of claim 2, the regulation component includes a second resistance that facilitates controlling the current level, which is associated with the reference voltage level, such that the current level correspondingly decreases as the second resistance increases.

4. The system of claim 3, a value of the second resistance is determined based at least in part on a value of the first resistance.

5. The system of claim 1, further comprising at least one of a word-line regulator component or a bit-line regulator component that receives the reference voltage and supplies a voltage to at least one of a word-line or a bit-line, the voltage is based at least in part on the reference voltage.

6. The system of claim 1, the memory is a flash memory, the flash memory is at least one of a single-bit memory or a multi-bit memory.

7. A device comprising the system of claim 1, wherein the device is at least one of a computer, a personal digital assistant, a cellular phone, a digital phone, an answering machine, a video device, a television, a digital versatile diskplayer/recorder, a music player/recorder, an MP3 player, a digital recorder, a digital camera, a microwave oven, an electronic organizer, an electronic toy, an electronic game, a scanner, a reader, a printer, a copy machine, or a facsimile machine.

8. A method that facilitates performing operations in a memory, comprising:
   controlling a reference voltage level based at least in part on an optimal operating temperature slope associated with the memory to facilitate executing an operation in the memory;
   controlling a current level based at least in part on a resistance associated with the reference voltage level;
   analyzing components of the memory;
   determining the optimal operating temperature slope;
   generating trim bit data associated with the optimal operating temperature slope;
   receiving the trim bit data;
   storing the trim bit data;
   reading the trim bit data;
   setting a first resistance level based at least in part on the trim bit data; and setting a second resistance level based at least in part on the trim bit data.

9. The method of claim 8, further comprising:
determining a first resistance level based at least in part on the optimal operating temperature slope to facilitate controlling the reference voltage level;
determining the second resistance level based at least in part on the first resistance level.

10. The method of claim 9, further comprising:
determining the first resistance level and the second resistance level based at least in part on a ratio of the first resistance level divided by the second resistance level.

11. The method of claim 8, further comprising:
setting control signals based at least in part on the trim bit data; and
at least one of shorting or unshorting at least one resistor based at least in part on the signals of the control signals.

12. The method of claim 8, further comprising:
providing the reference voltage level;
comparing the reference voltage level to a generated voltage level;
generating another voltage level that is determined based at least in part on the comparison of the reference voltage level with the generated voltage level;
supplying the other voltage level to at least one of a word-line or a bit-line, where the generated voltage level is equal to the reference voltage level;
selecting at least one memory cell in the memory; and
executing an operation in the memory.

13. A system that facilitates performing operations in a memory, comprising:
means for regulating a reference voltage level associated with at least one of a word-line or a bit-line based at least in part on an optimal operating temperature slope associated with the memory in order to facilitate performing an operation in the memory;
means for regulating a current level associated with the reference voltage level;
means for determining the optimal operating temperature slope;
means for generating data associated with at least one trim bit based at least in part on the optimal operating temperature slope;
means for reading the generated data associated with the at least one trim bit when the memory is powered up; and
means for storing the generated data in a temporary storage where the generated data is used to facilitate selection of the at least one trim bit, the at least one trim bit is associated with at least one of the reference voltage level or a current level.

14. The system of claim 13, further comprising:
means for determining a first resistance associated with the reference voltage level;
means for determining a second resistance, a value of the second resistance is determined as a function a value of the first resistance;
means for setting the value of the first resistance; and
means for setting the value of the second resistance.

15. The system of claim 1, the regulation control component increases the reference voltage during a programming operation associated with the memory when operating at an increased temperature as compared to a lower temperature associated with the memory during a read operation, in accordance with the operating temperature slope level.

16. The system of claim 1, the analyzer component determines the operating temperature slope level based at least in part on material used to form the memory.

17. The system of claim 1, the operating temperature slope level is a positive operating temperature slope level that is indicative of at least one higher reference voltage that corresponds to at least one higher temperature level in relation to a first operation and indicative of at least one lower reference voltage that corresponds to at least one lower temperature level in relation to a second operation.

18. The system of claim 3, the second resistance is placed in parallel with the first resistance in a band gap circuit to facilitate control of the current level.

19. The method of claim 8, further comprising:
at least one of:
controlling the reference voltage level to increase the reference voltage level during a programming operation associated with the memory when operating at an increased temperature as compared to a lower temperature associated with the memory during a different operation or no operation, in accordance with the optimal operating temperature slope, or
controlling the reference voltage level to decrease the reference voltage level during the different operation or no operation when operating at the lower temperature associated with the memory, in accordance with the optimal operating temperature slope.

20. The method of claim 8, further comprising:
controlling the reference voltage level based at least in part on a first resistance; and
controlling the current level based at least in part on the first resistance and a second resistance associated with the reference voltage level, wherein the second resistance is determined based at least in part on the first resistance.

* * * * *